United States Patent
Moon

(10) Patent No.: US 8,163,190 B2
(45) Date of Patent: Apr. 24, 2012

(54) METHOD FOR FABRICATING A FINE PATTERN

(75) Inventor: Jae In Moon, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 799 days.

(21) Appl. No.: 12/104,811

(22) Filed: Apr. 17, 2008

(65) Prior Publication Data

US 2009/0093121 A1  Apr. 9, 2009

(30) Foreign Application Priority Data

Oct. 4, 2007 (KR) .................. 10-2007-0099809

(51) Int. Cl.
*C23F 1/00* (2006.01)
*H01L 21/00* (2006.01)

(52) U.S. Cl. .................. 216/41; 430/313; 257/E21.038; 257/E21.039

(58) Field of Classification Search .................. 216/41; 430/313; 257/E21.038, E21.039
See application file for complete search history.

(56) References Cited

U.S. PATENT DOCUMENTS

| 6,745,372 | B2 | 6/2004 | Côté et al. |
| 6,944,844 | B2 | 9/2005 | Liu |
| 2003/0230234 | A1* | 12/2003 | Nam et al. .................. 117/97 |
| 2006/0273457 | A1* | 12/2006 | Sel et al. .................. 257/734 |
| 2007/0161251 | A1 | 7/2007 | Tran et al. .................. 438/725 |

FOREIGN PATENT DOCUMENTS

| KR | 10-2002-0036139 | | 5/2002 |
| KR | 10-2002-0036139 A | * | 5/2002 |
| KR | 10-2007-0069914 | | 7/2007 |

* cited by examiner

*Primary Examiner* — Lan Vinh
*Assistant Examiner* — David Kaufman
(74) *Attorney, Agent, or Firm* — Marshall, Gerstein & Borun LLP

(57) ABSTRACT

In a method for fabricating a fine pattern, a target layer to be patterned is formed on a semiconductor substrate. A sacrificial pattern is formed on the target layer. The sacrificial pattern includes first sacrificial patterns arranged at a first spacing, and second and third sacrificial patterns arranged in pairs at a second spacing less than the first spacing. A spacer having a first portion and a second portion is formed. The first portion is attached to sidewalls of the first sacrificial patterns, and the second portion is attached on both facing sides of the second and third sacrificial patterns to fill a gap defined by the second spacing. The second portion has a critical dimension greater than the first portion. The sacrificial pattern is selectively removed. A fine pattern is formed with partially different critical dimensions by transferring the critical dimensions of the first and second portions of the spacer by performing a selective etch process on the target layer using the spacer as an etch mask.

7 Claims, 8 Drawing Sheets

METHOD FOR FABRICATING A FINE PATTERN

CROSS-REFERENCE TO RELATED APPLICATIONS

The present application claims priority to Korean patent application number 10-2007-0099809, filed on 4 Oct. 2007 which is incorporated by reference in its entirety.

BACKGROUND OF THE INVENTION

This patent relates to a semiconductor device, and more particularly, to a method for fabricating a fine pattern of partially different critical dimensions (CDs) by lithography process.

Semiconductor devices may be integrated on a wafer by lithography using a photomask. To meet the growing needs for smaller and higher-performance semiconductor devices, developers work toward making technologies that can fabricate much finer patterns on a wafer. Wafer pattern size depends on, among other things, the limitation of exposure resolution of lithography. Therefore, a variety of technologies that can overcome the limitation of exposure resolution have been developed in order for fabrication of much finer patterns.

A double expose & etch technology (DEET) is proposed as a fabrication technology of sub-50 nm semiconductor devices. According to the DEET, spacers are formed and fine patterns are then formed using the spacers as an etch mask. The forming of the spacer includes forming a sacrificial pattern on an etch target layer, depositing spacer layer on sidewalls of the sacrificial pattern, and performing a spacer etch process. The sacrificial pattern is selectively removed, and fine patterns are formed by etching the underlying etch target layer using the spacers as an etch mask.

The shape of the fine pattern is determined by the shape of the spacer. Since the spacer is attached to the sidewalls of the sacrificial pattern, the spacer has a shape of a loop shape or rim shape line pattern attached to the sidewalls of the sacrificial pattern. Therefore, the fine pattern is also formed in a shape of the loop shape line pattern. In the actual fabrication process, however, a gate pattern, a bit line pattern, or an interconnection wire pattern, which will be formed on a semiconductor substrate, is not a loop type line pattern. Thus, an interconnection portion of the loop shape pattern needs to be selectively etched and separated. After a first exposure process and a first etch process of forming the sacrificial pattern, a second exposure process and a second etch process for separation are subsequently performed. Therefore, the formation of the fine pattern requires the exposure process and the etch process to be performed at least two times. Hence, at least two different photomasks are needed.

Since the fine pattern is formed by the etch process using the spacer as the etch mask, a CD of the fine pattern is determined depending on a CD of the spacer. Therefore, when forming fine patterns with different CDs at the same layer level, a third exposure process and a third etch process using an additional third photomask may be performed for forming the different size fine patterns.

In a semiconductor memory device, gate patterns of cell transistors are arranged with the substantially same CD at the same spacing. However, interconnection pads for transferring circuit signals to the gate patterns are provided to be positioned at edges of the respective gate patterns. When the gate patterns are formed by the fine pattern fabrication process using the spacer, a third exposure process and a third etch process using an additional third photomask may be performed for forming the interconnection pads, which have a larger CD and are connected to the gate patterns. Since the exposure process is performed three times, the number of required photomasks increases and thus the development expense for new device increases. In addition, an overlay margin between the exposure processes decreases and the complexity of an entire fabrication process increases. Furthermore, it may take a relatively longer time to perform the fabrication process and develop the semiconductor fabrication process.

SUMMARY OF THE INVENTION

Embodiments of the present invention are directed to a method for fabricating fine patterns of different CDs using a spacer forming process.

In one embodiment, a method for fabricating a fine pattern includes: forming a target layer to be patterned on a semiconductor substrate; forming a sacrificial pattern on the target layer, the sacrificial pattern including first sacrificial patterns arranged at a first spacing, and second and third sacrificial patterns arranged in pairs at a second spacing less than the first spacing; forming a spacer including a first portion and a second portion, the first portion being attached to sidewalls of the first sacrificial patterns, the second portion being attached on both facing sides of the second and third sacrificial patterns to fill a gap defined by the second spacing, wherein the second portion has a critical dimension greater than the first portion; selectively removing the sacrificial pattern; and forming a fine pattern with partially different critical dimensions by transferring the critical dimensions of the first and second portions of the spacer by performing a selective etch process on the target layer using the spacer as an etch mask.

In another embodiment, a method for fabricating a fine pattern includes: forming a target layer to be patterned on a semiconductor substrate; forming a sacrificial pattern on the target layer, the sacrificial pattern including first sacrificial patterns having a line shape and arranged at a first spacing, second sacrificial patterns connected to edges of the first sacrificial patterns, and third sacrificial patterns isolated at a second spacing narrower than the first spacing and arranged to face the second sacrificial patterns; forming a spacer on sidewalls of the sacrificial pattern to selectively fill a gap defined by the second spacing and expose the target layer corresponding to the first spacing; selectively removing the sacrificial pattern; and forming a fine pattern with partially different critical dimensions by selectively etching the exposed portion of the target layer using the spacer as an etch mask.

In still another embodiment, a method for fabricating a fine pattern includes: sequentially forming a first target layer of a conductive material and a second target layer of an insulation material on a semiconductor substrate; forming a sacrificial pattern on the second target layer, the sacrificial pattern including first sacrificial patterns having a line shape and arranged at a first spacing, second sacrificial patterns connected to edges of the first sacrificial patterns, and third sacrificial patterns isolated at a second spacing narrower than the first spacing and arranged to face the second sacrificial patterns; forming spacers having first portions attached to sidewalls of the first sacrificial patterns, and second portions attached on both facing sidewalls of the second and third sacrificial patterns to fill the portion defined by the second spacing, the second portions having a wider critical dimension than the first portions; selectively removing the sacrificial pattern; forming a fine pattern with partially different critical dimensions by transferring the critical dimensions of the first and second portions of the spacer by selectively etching the second target layer using the spacer as a first etch mask; and forming a conductive line and a pad, which is connected to the conductive line and has a critical dimension equal to the second spacing, by selectively etching the exposed portion of the first target layer using the fine pattern as a second etch mask.

The forming of the sacrificial pattern may include: forming a sacrificial layer on the second target layer, the sacrificial layer having an etch selectivity with respect to the second target layer; forming a first photoresist pattern with a layout of the sacrificial pattern on the sacrificial layer; and selectively etching a portion of the sacrificial layer exposed by the first photoresist pattern.

The spacer may have a critical dimension greater than half of the second spacing and less than half of the first spacing.

The method may further include: forming a second photoresist pattern exposing a connection portion connecting the second portions of the spacer; and performing an edge cut process to selectively etch the connection portion of the spacer exposed by the second photoresist pattern.

DESCRIPTION OF SPECIFIC EMBODIMENTS

Embodiments of the present invention provide methods for forming a fine pattern of partially different critical dimensions (CDs) using a spacer forming process. Examples of the fine pattern include a pad portion with a relatively large CD and a line portion with a relatively small CD. The pad portion and the line portion are formed in a single exposure process and a single etch process. Although a single photomask is used in a process of forming a sacrificial pattern to shape a spacer, the fine patterns can be formed to have the pad portion and the line portion with different CDs.

The layout of the photomask for the sacrificial patterns can be designed such that they include a block-shaped CD extension portion spaced apart from the pad portion by a predetermined distance, as well as the line portion and the pad portion of the sacrificial patterns. The CD extension portion of the sacrificial pattern is arranged on the layout such that a spacing between the CD extension portion and the pad portion is less than two times the CD of the spacer. Accordingly, since the spacer attached to the sacrificial pattern is overlapped to fill the gap between the CD extension portion and the pad portion, the CD of the filling portion of the spacer can substantially extend up to two times, compared with another portion attached to the line portion.

In the embodiments of the present invention, even though the fine patterns are formed to have different CDs, the fine patterns can be formed by a single exposure process and a single etch process using a single photomask. An additional photomask for pad portion is not required. Thus, the number of photomasks required in the entire process can be reduced and the process development time can be reduced. Furthermore, the number of process steps and the fabrication process time can be reduced in the actual process of forming the fine pattern.

Figure 1A:
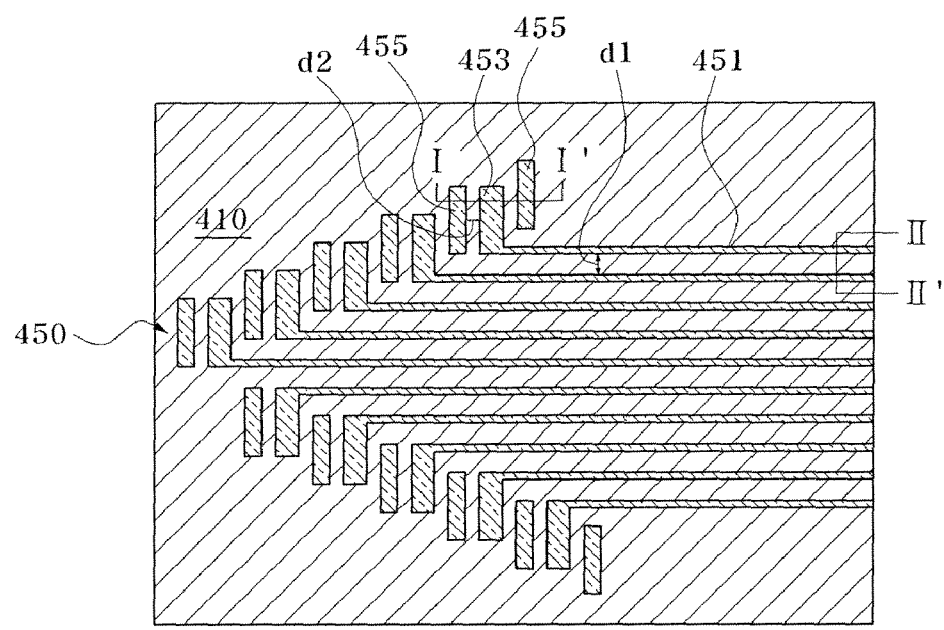
FIGS. 1A and 1B illustrate a process of forming a first photoresist pattern according to an embodiment of the present invention.
Figure 1B:
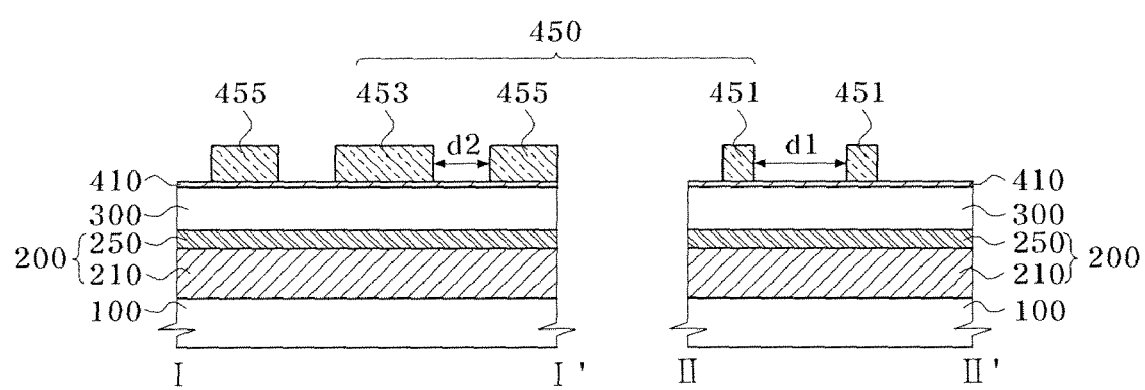

FIGS. 1A and 1B illustrate a process of forming a first photoresist pattern 450 for sacrificial patterns according to an embodiment of the present invention. Specifically, FIG. 1B illustrates cross-sectional views taken along lines I-I' and II-II' of FIG. 1A. Referring to FIG. 1B, a target layer 200 to be patterned into fine patterns is deposited on a semiconductor substrate 100 such as a silicon substrate. The target layer 200 may include a first target layer 210 and a second target layer 250. The first target layer 210 may include a conductive layer to be patterned into circuit patterns substantially constructing a circuit of a semiconductor device, and the second target layer 250 may be an insulation layer that will be used as an etch mask or a hard mask in a process of etching the conductive layer. In forming gate patterns of transistors, the first target layer 210 may include a metal layer formed of conductive polysilicon or tungsten (W). In addition, the second target layer 250 may be formed of silicon nitride ($Si_3N_4$) having an etch selectivity with respect to the conductive layer of the first target layer 210.

A sacrificial layer 300 is deposited on the target layer 200 so as to provide a template or mold for forming a spacer. At this point, the sacrificial layer 300 may be formed of an insulation material, e.g., silicon oxide ($SiO_2$), which has an etch selectivity with respect to the insulation material of the second target layer 250. A photoresist pattern 450 having a shape illustrated in FIG. 1A is formed on the sacrificial layer 300 by performing a first exposure process. The first photoresist pattern 450 is used as an etch mask for patterning the sacrificial layer 300.

Referring to FIGS. 1A and 1B, a bottom antireflective coating (BARC) 410 may be deposited on the sacrificial layer 300 so as to suppress a scattered reflection of the lower material in the exposure process. Then, the first photoresist layer is coated on the bottom antireflective coating 410. A first photoresist pattern 450 is formed by performing a first exposure process using a first photomask where a layout to be transferred on the first photoresist layer is formed in a mask pattern.

FIG. 1B illustrates an exemplary layout of the first photoresist pattern 450 for forming the sacrificial pattern, which can be applied in forming a pattern having a pad portion and a line portion with different CDs. The layout of the first photoresist pattern 450 may be designed such that it includes a first body portion 451, a second body portion 453, and a CD extension portion 455.

For example, the first body portions 451 are formed in a line shape with a first spacing d1. The second body portions 453 extend at edges of the first body portions 451 in a direction different from, preferably perpendicular to, the extension direction of the first body portions 451. At this point, due to the CD extension portions 455, the spacers formed in a subsequent process have different CDs. The CD extension portions 455 are formed in a block shape at a second spacing d2 from the second body portions 453. The CD extension portion 455 extends to face the second body portion 453 and has the same length as the facing side of the second body portion 453. The second spacing d2 is set to less than two times the CD of the spacer, which will be formed later. Accordingly, the second spacing d2 is set to greater than at least the first spacing d1.

Figure 2A:
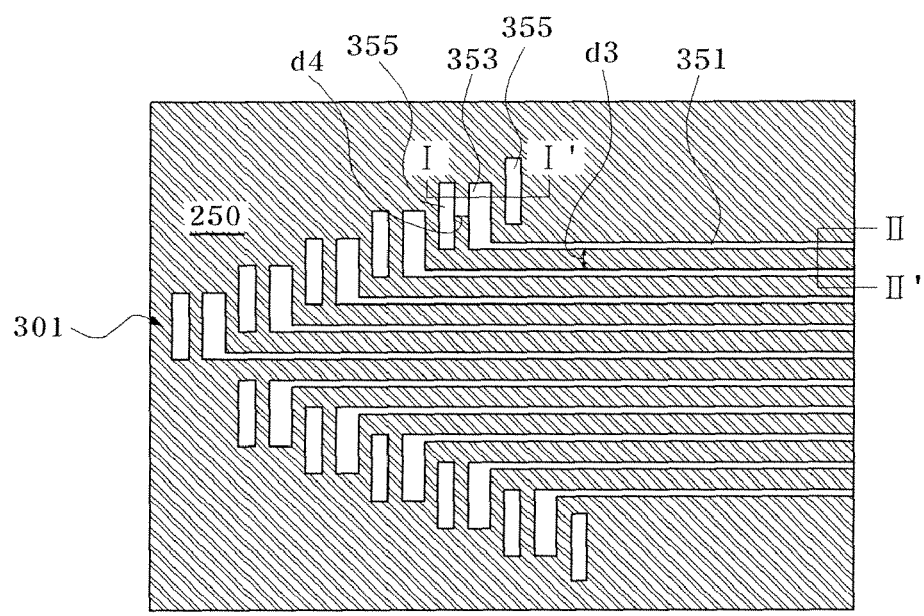
FIGS. 2A and 2B illustrate a process of forming a sacrificial pattern according to an embodiment of the present invention.
Figure 2B:
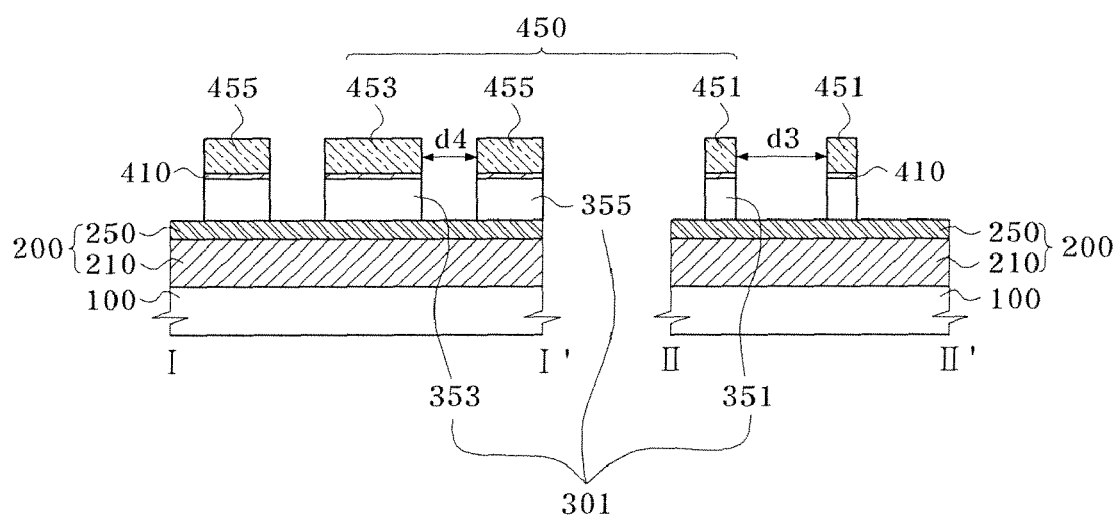

FIGS. 2A and 2B illustrate a process of forming a sacrificial pattern 301 according to an embodiment of the present invention. As illustrated in FIG. 2B, a sacrificial pattern 301 is formed by performing a selective etch process on a sacrificial layer (300 of FIG. 1B) using the first photoresist pattern 450 as an etch mask. At this point, the selective etch process is performed to expose the surface of the second target layer 250. The sacrificial pattern 301 is patterned in a plan layout of FIG. 2A in accordance with the plan layout of the first photoresist pattern 450 serving as the etch mask. Therefore, the sacrificial pattern 301 includes a first sacrificial pattern 351, a second sacrificial pattern 353, and a third sacrificial pattern 355, which are respectively defined by the portions 451, 453 and 455 of the first photoresist pattern 450.

A third spacing d3 between the line-shaped first sacrificial patterns 351 is substantially equal to the first spacing d1 of FIG. 1A, and a fourth spacing d4 between the second sacrificial pattern 353 and the third sacrificial pattern 355 is substantially equal to the second spacing d2 of FIG. 1A. The photoresist pattern 450 and the bottom antireflective coating 410 remaining after forming the sacrificial pattern 301 are selectively removed.

Figure 3A:
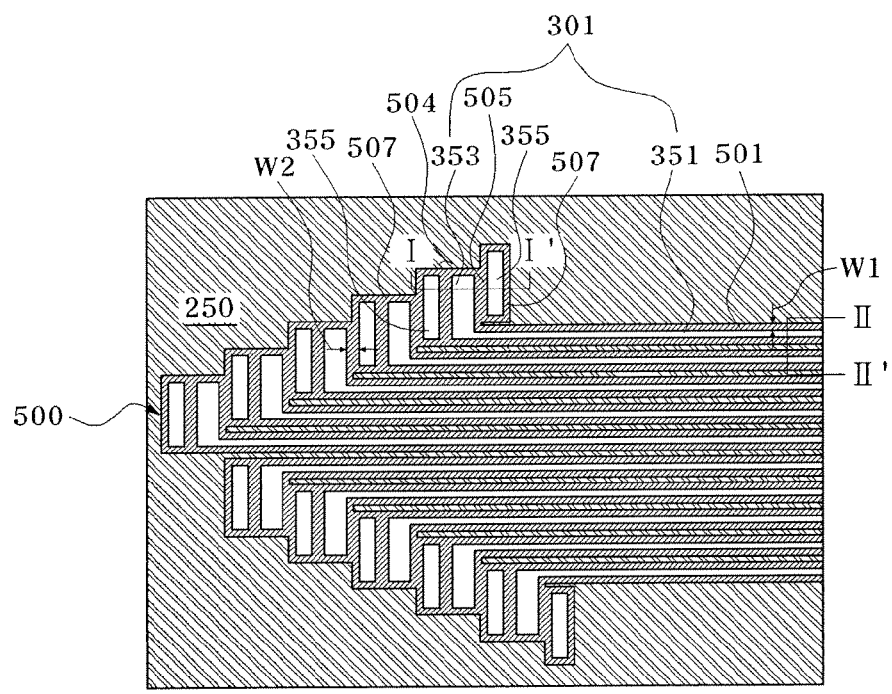
FIGS. 3A and 3B illustrate a process of forming a spacer according to an embodiment of the present invention.
Figure 3B:
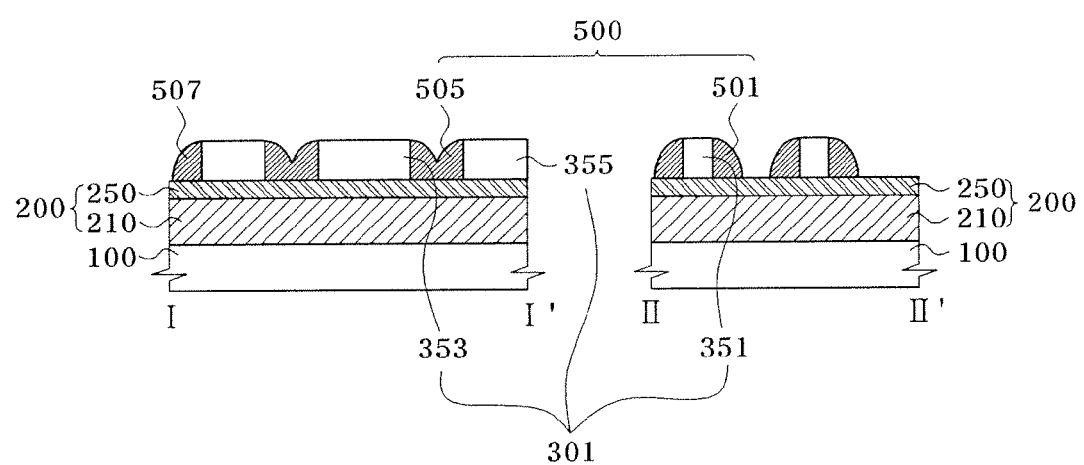

FIGS. 3A and 3B illustrate a process of forming a spacer 500 according to an embodiment of the present invention. A layer for a spacer 500 is deposited on the sacrificial pattern (301 of FIG. 2B), and the deposited spacer layer is anisotropically etched by a spacer etch process. The spacer etch process is performed to make the deposited spacer layer selectively remain only on sides of the sacrificial pattern 301 and to expose the upper surface of the sacrificial pattern 301 and the surface of the second target layer 250. For this etch process, the spacer 500 may be formed of a material having an etch selectivity with respect to the sacrificial pattern 301 or the underlying second target layer 250.

As illustrated in the plan layout of FIG. 3A, the line-shaped spacer 500 is formed on the sides of the sacrificial pattern 301. Since the spacer 500 is attached to all sides of the sacrificial pattern 301, it is formed in a loop type as illustrated in the plan layout of FIG. 3A. A first portion 501 of the line-shaped spacer has a first CD W1 at the sides of the line-shaped first sacrificial pattern 351 among the sacrificial patterns 301. At this point, the first CD W1 is determined substantially depending on the thickness of the layer deposited for the spacer 500.

The first CD W1 is determined considering the CD of the fine pattern to be actually fabricated. For example, the first CD W1 may be equal to an actual circuit CD of the semiconductor device, e.g., a CD of a gate pattern of a transistor. Therefore, the first spacing (d1 of FIG. 1A) or the third spacing (d3 of FIG. 2A) is set to greater than at least two times the first CD W1, preferably approximately three times, considering the CD of the gate pattern to be formed in a fine pattern and a spacing between the gate patterns.

Meanwhile, second portions 505 of the spacer attached to the sidewalls of the second sacrificial pattern 353 and the third sacrificial pattern 355 are overlapped at a gap 504 between the second sacrificial pattern 353 and the sacrificial pattern 355. Thus, the second portions 505 have a second CD W2 greater than the first CD W1. In order to make the second portions 505 overlap each other, the third sacrificial pattern 355 is arranged such that the fourth spacing (d4 of FIG. 2A) between the second sacrificial pattern 353 and the third sacrificial pattern 355 is set to less than two times the first CD W1. That is, since the position of the third sacrificial pattern 355 determining the fourth spacing (d4 of FIG. 2A) is determined by the arranged position of the CD extension portion 455 of the first photoresist pattern (450 of FIG. 1A), the second spacing d2 between the CD extension portion 455 and the second body portion 453 is set to less than two times the first CD W1.

As illustrated in the plan layout of FIG. 3A, since the spacers 500 are attached to the sidewalls of the sacrificial pattern 301, third portions 507 of the spacers are formed to connect the second portions 505 of the spacers.

Figure 4A:
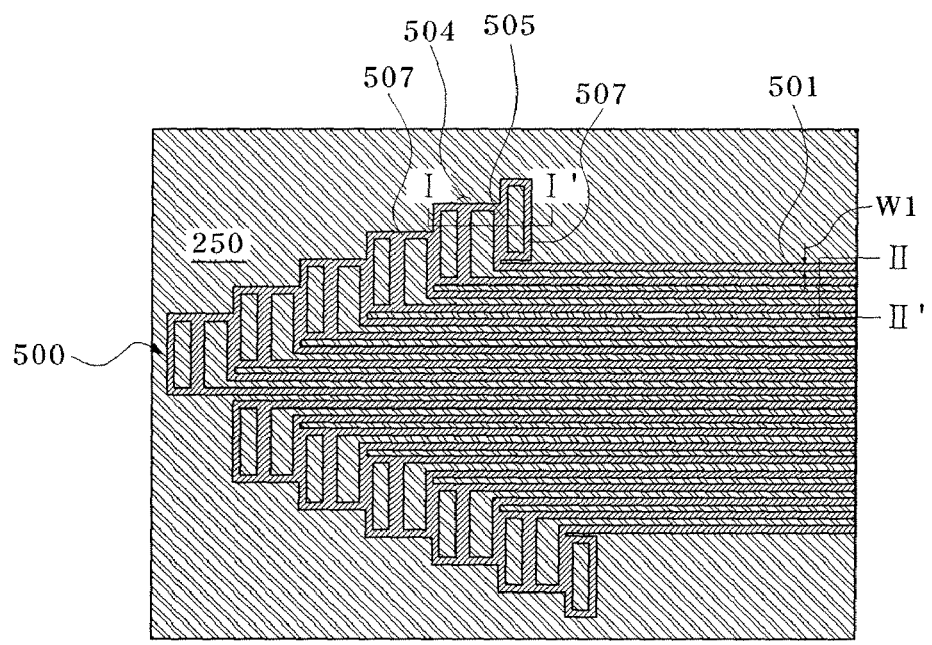
FIGS. 4A and 4B illustrate a process of selectively removing a sacrificial pattern according to an embodiment of the present invention.
Figure 4B:
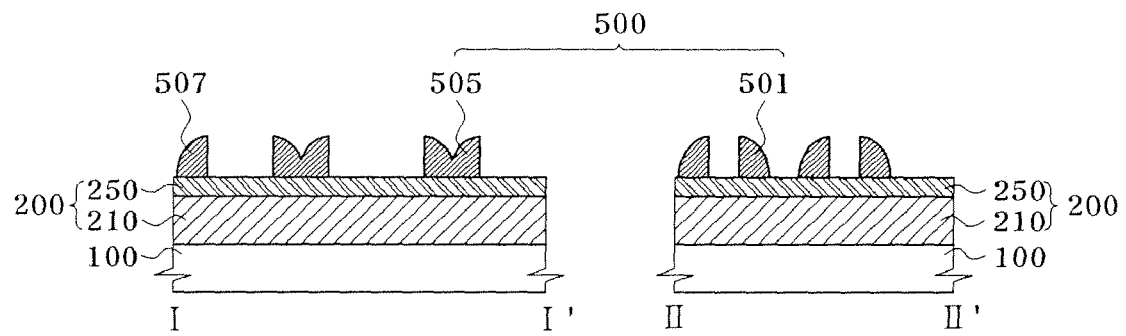

FIGS. 4A and 4B illustrate the spacer 500 remaining after the sacrificial pattern 301 is selectively etched. The sacrificial pattern 301 is selectively removed using an etch selectivity between the sacrificial pattern 301 and the spacer 500. Accordingly, the spacer 500 is formed on the second target layer 250 such that it serves as an etch mask exposing a portion of the second target layer 250, which will be etched in a subsequent process.

Figure 5A:
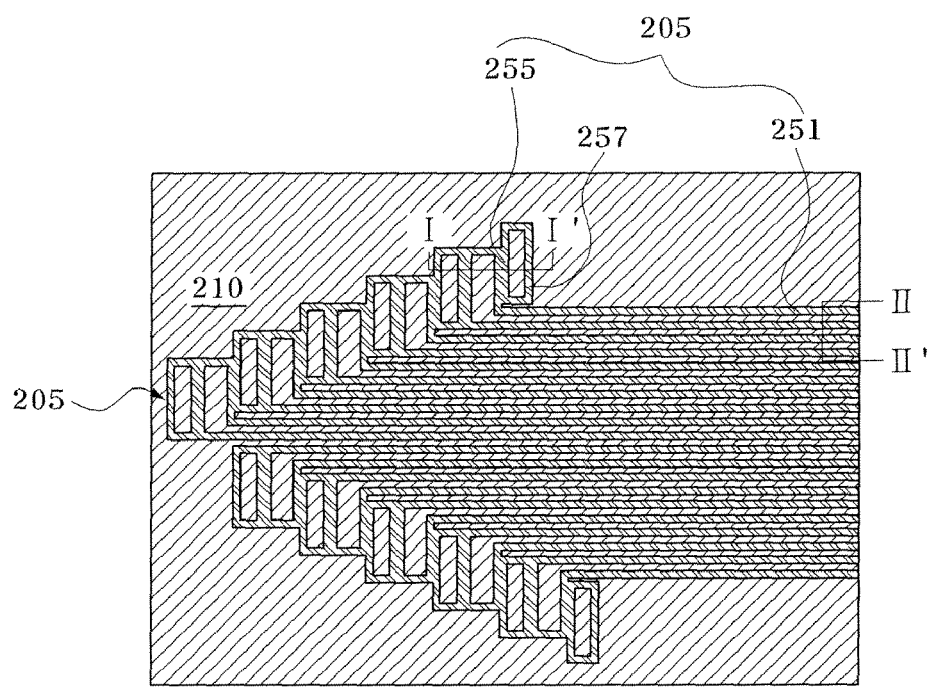
FIGS. 5A and 5B illustrate a process of forming a first fine pattern according to an embodiment of the present invention.
Figure 5B:
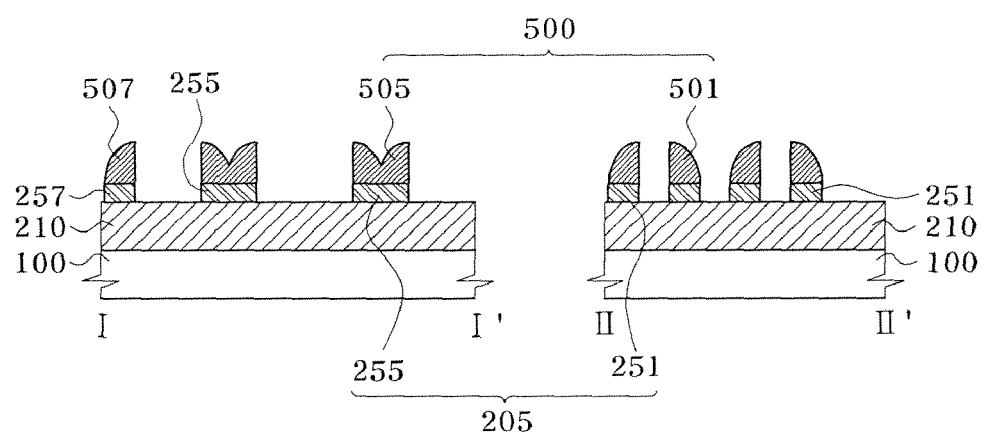

FIGS. 5A and 5B illustrate a process of forming a first fine pattern 205. The second target layer 250 is patterned by selectively etching the exposed portion of the second target layer 250 using the spacer 500 as an etch mask, thereby forming a first fine pattern 205. At this point, the selective etch process may be an anisotropic dry etch process to transfer the plan layout of the spacer 500 onto the first fine pattern 205. The first fine pattern 205 has a first body portion 251 and a second body portion 255. The first body portion 251 is defined by transferring the shape of the first spacer 501, so that it has a relatively long line shape and substantially has the first CD W1. The second body portion 255 is defined by transferring the shape of the second spacer 505, so that it has a relatively short line shape and substantially has the second CD W2. At this point, since the spacer 500 has a loop type line shape, an interconnection portion 257 is also formed to connect the first body portion 251 or the second body portion 255.

Figure 6A:
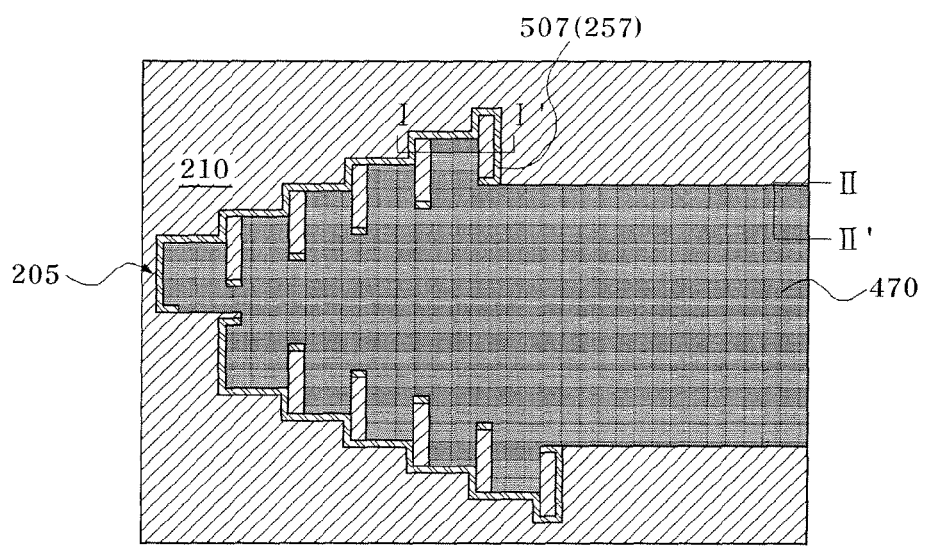
FIGS. 6A and 6B illustrate a process of forming a second photoresist pattern according to an embodiment of the present invention.
Figure 6B:
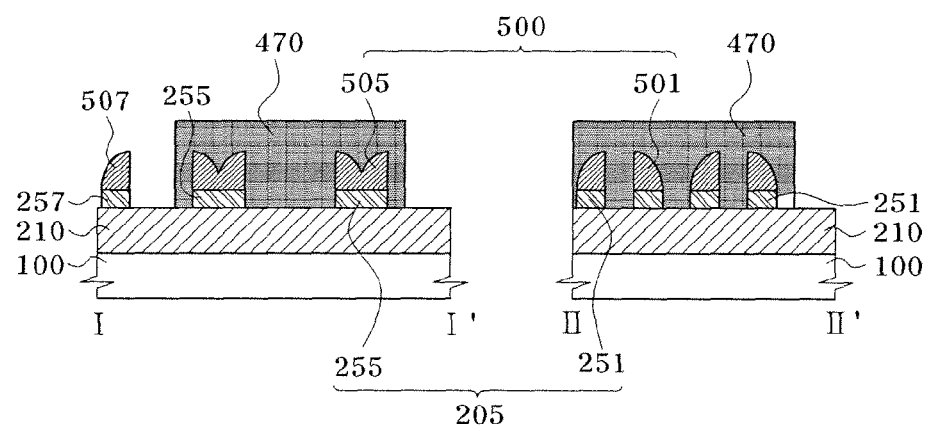

FIGS. 6A and 6B illustrate a process of forming a second photoresist pattern 470 exposing the third portion 507 of the spacer. Since the first fine pattern 205 is formed by transferring the loop type line shape of the spacer 500, an interconnection portion 257 defined by transferring a third portion 507, which is a loop type interconnection portion, is formed. For the circuit pattern of the semiconductor device, a cutting process needs to be performed to cut and separate the loop type shape selectively removing the interconnection portion 257 of the first fine pattern 205.

For the cutting and separating process, a second photoresist pattern 470 selectively exposing the third portion 507 of the spacer is formed. As illustrated in FIG. 6A, the layout of the second photoresist pattern 470 is designed that it exposes the third portion 507 corresponding to the interconnection portion 257. The forming of the second photoresist pattern 470 includes coating a photoresist layer, and performing a second exposure process on the coated photoresist layer using a second photomask where the layout is designed in a mask pattern. Since the third portion 507 is positioned at an edge portion of the spacer 500, the separating process can be understood as an edge cut process.

As illustrated in FIGS. 6A and 6B, after forming the second photoresist pattern 470, the exposed third portion 507 and the underlying interconnection portion 257 are selectively etched using the second photoresist pattern 470 as an etch mask. Thereafter, the second photoresist pattern 470 is selectively removed and the spacer 500 is selectively removed.

Figure 7A:
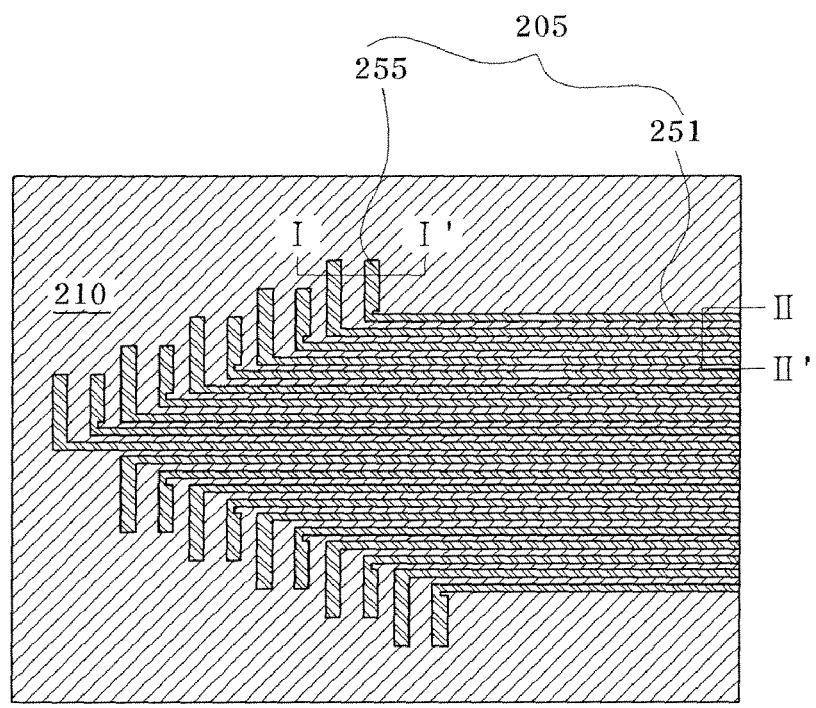
FIGS. 7A and 7B illustrate a process of etching an edge of a first fine pattern according to an embodiment of the present invention.
Figure 7B:
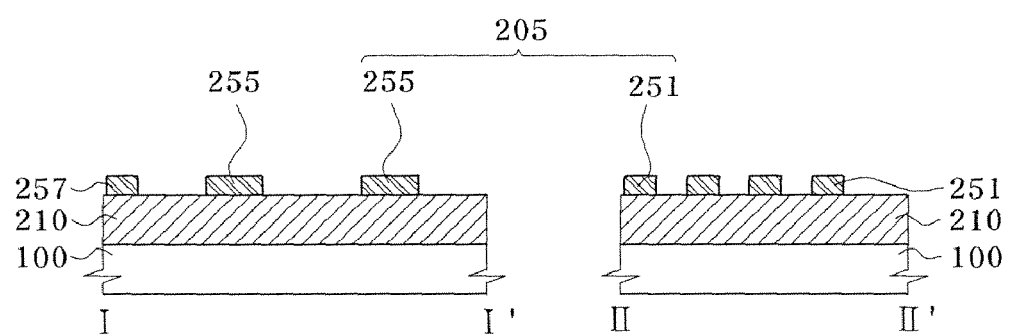

FIGS. 7A and 7B illustrate a separated first fine pattern 205. The separated first fine pattern 205 includes a first body portion 251 having a shape of a relatively long line with the first CD W1, and a second body portion 255 having a shape of a relatively short line with the second CD W2. When the first target layer 210 is a conductive layer, the first fine pattern 205 may be used as an etch mask or a hard mask in a process of selectively etching the first target layer 210.

Figure 8A:
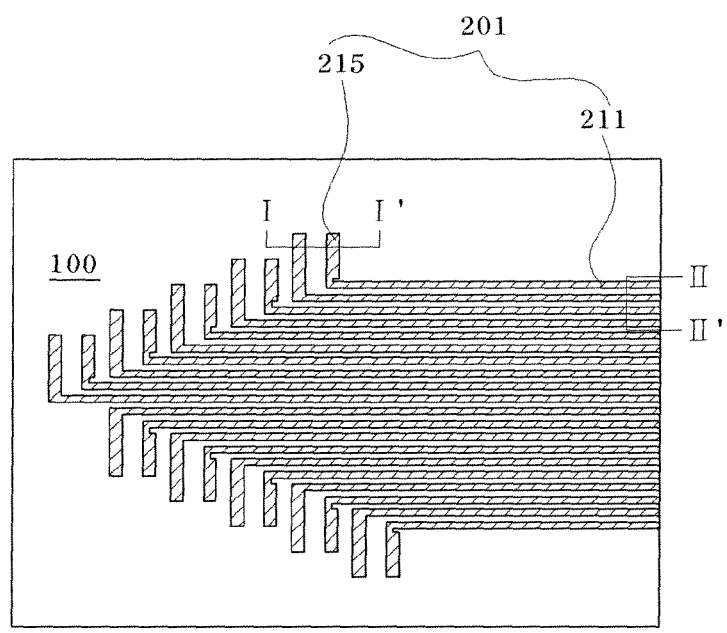
FIGS. 8A and 8B illustrate a process of forming a second fine pattern according to an embodiment of the present invention.
Figure 8B:
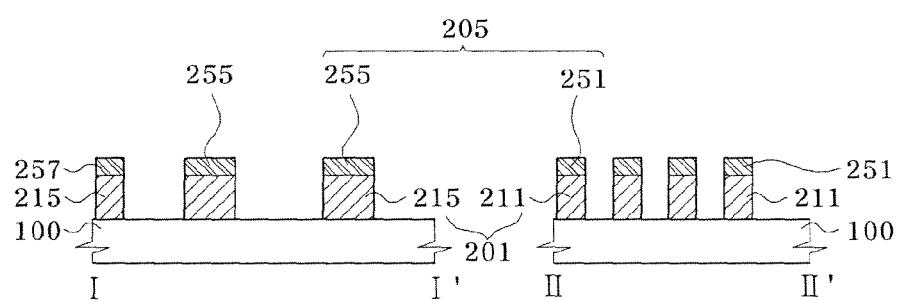

FIGS. 8A and 8B illustrate a second fine pattern 201. An exposed portion of the first target layer 210 is selectively etched using the first fine pattern 205 as an etch mask. Since the shape of the first fine pattern 205 is transferred onto the second fine pattern 201, the second fine pattern 201 includes a first body portion 211 having a shape of a relatively long line with the first CD W1, and a second body portion 215 having a shape of a relatively short line with the second CD W2.

In a semiconductor device, gate patterns are repetitively arranged in a line shape in a cell region, and pad portions for electrical connection to lines are formed at edges of the gate patterns. When the second fine pattern 201 is used as a gate pattern and a pad portion of a cell transistor, the first body portion 211 serves as a body of the gate pattern, and the second body portion 215 serves as the pad portion.

Although the gate patterns and the pad portions have been exemplarily described, the above embodiments can also be applied to a case where two separated patterns have different CDs. Furthermore, although it has been described in the above embodiments that the separating process of cutting the edge of the pattern is performed after the etch process of forming the first fine pattern 205, the separating process can also be performed after the forming of the spacer 500 or after the forming of the second fine pattern 201. When the separating process is performed after the etch process of forming the first fine pattern 205, it is more advantageous to prevent the contamination of the second fine pattern 201.

As described above, when forming the fine pattern, e.g., the pad portion and the gate pattern, having with different CDs is formed, the use of the photomask for separate pads can be omitted by inserting the CD extension portion 455 into the layout. That is, although the second fine pattern 201 is formed to have the first body portion 211 and the second body portion 215 with the different CDs, it is possible to omit a third exposure process using a third photomask for the different CD of the second body portion 215. Therefore, a total number of required photomasks can be reduced and the fabrication time and cost can be significantly reduced. Furthermore, the second body portion 215 and the first body portion 211 are substantially formed in the first exposure process using a single first photomask. Therefore, when the third exposure process using the additional third photomask is performed, it is impossible to fundamentally prevent the overlay error between the exposure processes. Consequently, the overlay margin in the whole processes can be improved.

By using the spacer forming process, the fine pattern with partially different CDs can be formed using a single photomask.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a fine pattern, the method comprising:
    forming a target layer to be patterned on a semiconductor substrate;
    forming a sacrificial pattern on the target layer, the sacrificial pattern including first sacrificial patterns having a line shape and arranged at a first spacing, second sacrificial patterns connected to edges of the first sacrificial patterns, and third sacrificial patterns isolated at a second spacing narrower than the first spacing and arranged to face the second sacrificial patterns, wherein the third sacrificial patterns have a block shape extending in a direction perpendicular to the line shape of the first sacrificial patterns and the third sacrificial patterns are spaced from the sides of the second sacrificial patterns and are not connected to the second and first sacrificial patterns;
    forming a spacer on sidewalls of the sacrificial pattern to selectively fill a gap defined by the second spacing and expose the target layer corresponding to the first spacing;
    selectively removing the sacrificial pattern; and
    forming a fine pattern with partially different critical dimensions by selectively etching the exposed portion of the target layer using the spacer as an etch mask.

2. The method of claim 1, wherein the spacer has a critical dimension greater than half of the second spacing and less than half of the first spacing.

3. The method of claim 2, wherein the fine pattern includes a first critical dimension portion defined by transferring a portion corresponding to the first spacing of the spacer, and a second critical dimension portion defined by transferring another portion filling the second spacing.

4. A method for fabricating a fine pattern, the method comprising:
    sequentially forming a first target layer of a conductive material and a second target layer of an insulation material on a semiconductor substrate;
    forming a sacrificial pattern on the second target layer, the sacrificial pattern including first sacrificial patterns having a line shape and arranged at a first spacing, second sacrificial patterns connected to edges of the first sacrificial patterns, and third sacrificial patterns isolated at a second spacing narrower than the first spacing and arranged to face the second sacrificial patterns, wherein the third sacrificial patterns have a block shape extended in a direction perpendicular to the line shape of the first sacrificial patterns and the third sacrificial patterns are spaced from the sides of the second sacrificial patterns and are not connected to the second and first sacrificial patterns;
    forming spacers having first portions attached to sidewalls of the first sacrificial patterns, and second portions attached on both facing sidewalls of the second and third sacrificial patterns to fill the portion defined by the second spacing, the second portions having a wider critical dimension than the first portions;
    selectively removing the sacrificial pattern;
    forming a fine pattern with partially different critical dimensions by transferring the critical dimensions of the first and second portions of the spacer by selectively etching the second target layer using the spacer as a first etch mask; and
    forming a conductive line and a pad, which is connected to the conductive line and has a critical dimension equal to the second spacing, by selectively etching the exposed portion of the first target layer using the fine pattern as a second etch mask.

5. The method of claim 4, wherein the forming of the sacrificial pattern comprises:

forming a sacrificial layer on the second target layer, the sacrificial layer having an etch selectivity with respect to the second target layer;

forming a first photoresist pattern with a layout of the sacrificial pattern on the sacrificial layer; and selectively etching a portion of the sacrificial layer exposed by the first photoresist pattern.

6. The method of claim 4, wherein the spacer has a critical dimension greater than half of the second spacing and less than half of the first spacing.

7. The method of claim 4, further comprising:

forming a second photoresist pattern exposing a connection portion connecting the second portions of the spacer; and performing an edge cut process to selectively etch the connection portion of the spacer exposed by the second photoresist pattern.

* * * * *